(12) United States Patent
Rosskopf et al.

(10) Patent No.: US 7,126,154 B2
(45) Date of Patent: Oct. 24, 2006

(54) TEST STRUCTURE FOR A SINGLE-SIDED BURIED STRAP DRAM MEMORY CELL ARRAY

(75) Inventors: Valentine Rosskopf, Pöttmes (DE); Susanne Lachenmann, München (DE); Sibina Sukman-Prähofer, München (DE); Andreas Felber, Dresden (DE)

(73) Assignee: Infineon Technologies AG, München (DE)

( * ) Notice: Subject to any disclaimer, the term of this patent is extended or adjusted under 35 U.S.C. 154(b) by 250 days.

(21) Appl. No.: 10/933,497

(22) Filed: Sep. 3, 2004

(65) Prior Publication Data

US 2005/0051765 A1  Mar. 10, 2005

(30) Foreign Application Priority Data

Sep. 4, 2003  (DE) ................ 103 40 714

(51) Int. Cl.
*H01L 23/58* (2006.01)
*H01L 29/10* (2006.01)
*H01L 27/108* (2006.01)
*H01L 29/76* (2006.01)
*H01L 31/119* (2006.01)

(52) U.S. Cl. ............ 257/48; 257/296; 257/301; 257/905; 257/908; 257/E27.097; 257/E27.092

(58) Field of Classification Search ............ None
See application file for complete search history.

(56) References Cited

U.S. PATENT DOCUMENTS

| | | | |
|---|---|---|---|
| 6,310,361 B1 * | 10/2001 | Lichter ................ | 257/48 |
| 6,339,228 B1 | 1/2002 | Iyer et al. | |
| 6,459,113 B1 * | 10/2002 | Morihara et al. ....... | 257/296 |
| 6,469,335 B1 * | 10/2002 | Hofmann .............. | 257/296 |
| 2002/0028550 A1 * | 3/2002 | Morihara et al. ....... | 438/241 |
| 2002/0195669 A1 * | 12/2002 | Morihara et al. ....... | 257/390 |

* cited by examiner

*Primary Examiner*—David E. Graybill
(74) *Attorney, Agent, or Firm*—Morrison & Foerster LLP

(57) ABSTRACT

A test structure for determining the electrical properties of a memory cell in a matrix-like cell array constructed on the basis of the single-sided buried strap concept has a connection between internal electrodes in the storage capacitors in two adjacent memory cells in the direction of the row of active regions in order to produce a series circuit. A first selection transistor and a first storage capacitor in a first memory cell and a second selection transistor and a second storage capacitor in a second memory cell, the active regions of the first and second selection transistors not being connected between the first and second selection transistors via a contact-making bit line.

5 Claims, 5 Drawing Sheets

TEST STRUCTURE FOR A SINGLE-SIDED BURIED STRAP DRAM MEMORY CELL ARRAY

CLAIM FOR PRIORITY

The application claims the benefit of priority to German Application No. 10340714.6, filed Sep. 4, 2003, the contents of which are hereby incorporated by reference.

TECHNICAL FIELD OF THE INVENTION

The invention relates to a test structure for determining the electrical properties of a memory cell and particularly the electrical properties of a selection transistor in a memory cell in a single-sided buried strap DRAM memory cell array.

BACKGROUND OF THE INVENTION

Dynamic random access semiconductor memories (DRAMs) contain a matrix of memory cells which are connected up in the form of rows via word lines and columns via bit lines. Data are read from the memory cells or data are written to the memory cells as a result of activation of suitable word and bit lines. A dynamic memory cell generally comprises a selection transistor and a storage capacitor, the selection transistor normally being in the form of a horizontally designed field effect transistor and comprising two diffusion regions which are isolated by a channel above which there is a gate which is connected to a word line. One of the diffusion regions of the selection transistor is connected to a bit line, and the other diffusion region is connected to the storage capacitor. Applying a suitable voltage to the gate via the word line turns on the selection transistor and permits a flow of current between the diffusion regions in order to charge the storage capacitor via the bit line.

The continual striving to reduce the size of DRAM memory chips has resulted in the design of DRAM memory cells in which the storage capacitor, in particular, uses the third dimension. Fundamental embodiments of three-dimensional storage capacitors which have been developed are trench capacitors and stack capacitors, with the trench capacitor type normally being used in DRAM memory cells. The trench capacitor comprises a trench which is etched into the semiconductor substrate and is filled with a highly conductive material which serves as an internal capacitor electrode. By contrast, the external capacitor electrode is buried in the substrate and is isolated from the internal capacitor electrode by a dielectric layer. The electrical connection between the diffusion region of the selection transistor and the first internal capacitor electrode is generally made in the upper trench region by a capacitor connection, which is normally in the form of a diffusion region and is called the buried strap.

To produce DRAM memory cell arrays having a memory cell comprising a planar selection transistor and a trench capacitor, use is normally made of process technologies in which the electrical junction is independent of the orientation of the diffusion regions of the selection transistors and the trench capacitors with respect to one another. In this production method, the active regions, i.e. the diffusion regions, of the selection transistor are arranged in rows in a first direction and the trench capacitors are arranged in rows in a second direction, which runs transversely with respect to the first direction, the conductive junctions between the active regions of the selection transistors and the trench capacitors on the overlapping areas of the rows which run at right angles to one another being respectively produced in both edge regions of the overlapping area in the first direction.

This double-sided buried-strap cell array concept is increasingly being replaced by the single-sided buried-strap concept, however, which can be used to produce cell array geometries which are easier to map lithographically. In the case of this cell array technology, the conductive junctions between the active regions of the selection transistors and the trench capacitors on the overlapping areas of the rows (running at right angles to one another) of active regions of the selection transistors in a first direction and trench capacitors in a second direction are respectively produced only in a single edge region in the first direction of the overlapping area in the first direction. By contrast, in the opposite edge region, the active region of the selection transistor is insulated from the underlying trench capacitor. This single-sided buried-strap cell array concept allows a checkerboard cell geometry to be produced, in particular, in which the memory cells at the crossover points between the active regions of the selection transistors and the trench capacitors in adjacent rows are arranged offset from one another.

DRAMs are normally produced in large numbers at the same time on a semiconductor plate, the wafer. When the DRAM memories are finished, they are split up by cracking and breaking or sawing at interspaces, kerfs, provided for this purpose. The semiconductor pieces with the individual DRAM memories, the DRAM chips, are then incorporated into a package and are electrically conductively connected to contact lugs.

Before the wafers are split into the individual chips, function tests for the individual DRAM memory cells are generally performed at wafer level. These function tests are intended to indicate the general operation of the memory cells. This also allows the electrical properties of the DRAM memory cells and hence particularly of the selection transistors to be characterized. At the same time, function tests are also performed on memory cells in which it is possible to vary important parameters, particularly of the selection transistors, in order to establish possible tolerances in the memory cell. In this case, the necessary measurements for the function tests are normally not performed on the memory cells themselves, but rather on special test structures which are produced together with the DRAM memory cells on the wafer, in order to ensure that the test structures indicate the operability or the electrical properties of the actual DRAM memory cells. The test structures are normally produced in space-saving fashion between the DRAM memories in the kerfs, that is to say the regions which are later used to split the wafer into the individual chips.

To test the test structures, automatic testers are generally used. These testers normally have an arrangement of test needles with 25 measuring tips arranged in a row which are used for simultaneously making contact with a corresponding number of contact areas on the test structures. Using the automatic testers, currents and voltages are applied to the test structure, and the electrical properties of the test components arranged between the contact areas are measured and evaluated in order to obtain statements about the quality of the production process for the DRAM memory cells on the wafer.

For the double-sided buried-strap DRAM memory cell concept, test structures for measuring the electrical properties of the individual DRAM memory cells and, at the same time, particularly the parameters of the selection transistors are already known. For the single-sided buried-strap cell concepts, on the other hand, the prior art has not yet developed any test structures for the individual DRAM memory cells, particularly the selection transistors, which can be used to ascertain the electrical properties of the DRAM elementary cells easily and accurately.

U.S. Pat. No. 6,339,228 D1 has disclosed test structures for a single-sided buried-strap DRAM memory cell array (Note: term is recorded in paragraph 1 on page 2 of the decision).

SUMMARY OF THE INVENTION

The invention provides a test structure for determining the electrical parameters of the DRAM memory cell and, at the same time, particularly of the selection transistor in a matrix-like memory cell array based on the single-side buried-strap concept.

In one embodiment of the invention, there is a test structure for determining the electrical properties of memory cells, including a selection transistor and a storage capacitor, in a matrix-like cell array constructed on the basis of the single-sided buried-strap concept, in which the conductive junctions between the active regions of the selection transistors and of the storage capacitors on overlapping areas of the rows (running at right angles to one another) of active regions of the selection transistors and storage capacitors are respectively produced in a single edge region of the overlapping area, has a connection between internal electrodes in the storage capacitors in two adjacent memory cells in order to produce a series circuit comprising a first selection transistor and a first storage capacitor in a first memory cell and a second selection transistor and a second storage capacitor in a second memory cell, the active regions of the first and second selection transistors not being connected between the first and second selection transistors via a contact-making bit line.

This embodiment of the test structure ensures that the geometry of the test structure essentially simulates that of the regular single-sided buried-strap DRAM memory cell array. The electrical connection between the internal electrodes in the two adjacent memory cells alters the single-sided buried-strap DRAM cell array geometry only to a minimal extent, which means that the test measurements permit a realistic statement about the electrical properties of the memory cell. As a result, it is also possible, in particular, to examine additional influences on the electrical properties, such as supply line resistances or the influence of switching adjacent word lines. It is also possible to vary the potentials on the gate electrodes in the selection transistors or on the adjacent word lines and storage capacitors during the measurement as additional parameters, in order to be able to determine the electrical parameters of the DRAM memory cell as accurately as possible.

In line with one preferred embodiment, the storage capacitors are trench capacitors, with the internal electrodes in the trench capacitors being connected to one another via a tunnel structure. This design, in which the internal electrodes in the two adjacent trench capacitors are preferably produced so as to be together, results in a minimal modification to the regular DRAM cell array geometry of the trench capacitors.

In yet another embodiment of the invention, there is a test structure based on the invention for determining the electrical properties of memory cells, comprising a selection transistor and a storage capacitor, in a matrix-like cell array constructed on the basis of the single-sided buried-strap concept, in which the conductive junctions between the active regions of the selection transistors and of the storage capacitors on overlapping areas of the rows (running at right angles to one another) of active regions of the selection transistors and storage capacitors are respectively produced in a single edge region of the overlapping area, has a further conductive connection between the internal electrode in a storage capacitor in a memory cell at the edge region of the overlapping area in the first direction, at which edge region the conductive connection is produced between the active region of the associated selection transistor and the internal electrode in the storage capacitor, and a bit line which is adjacent to the bit lines which make contact with the active region of the selection transistor.

This inventive form of the test structure ensures that the intervention in the regular DRAM memory cell geometry of the single-sided buried-strap concept remains at a minimum and at the same time the electrical properties of a single selection transistor with an associated storage capacitor in a memory cell can be determined. In addition, the inventive test structure concept ensures that the supply line effects are minimized during the electrical measurement.

In line with one preferred embodiment, the internal electrodes in the storage capacitors for a multiplicity of memory cells are in the form of conductive connections at the edge region of the overlapping areas, at which edge region the conductive connection is produced between the active region of the associated selection transistor and the internal electrode in the storage capacitor, to a bit line which is adjacent to the bit line which makes contact with the active region of the selection transistor, the length of the associated active regions of the selection transistors and/or the width of the associated gate electrode with the word line varying. This test structure concept can be used to test the electrical properties of the selection transistor in various selection transistor designs, particularly those which result from the tolerances during production.

In line with a further preferred embodiment, the storage capacitors are in the form of trench capacitors which have an essentially rectangular cross section in plan view, the conductive connection between the active region of the selection transistor and the internal electrode in the trench capacitor and the bit line which is adjacent to the bit line which makes contact with the active region of the selection transistor being produced on one longitudinal side of the rectangular cross section of the trench capacitor. This design permits simple production of the test structure with a high level of tolerance, since sufficient space is guaranteed to be prescribed at the edge of the storage capacitor in order to produce the two conductive connections.

BRIEF DESCRIPTION OF THE DRAWINGS

The invention is explained in more detail with reference to the exemplary drawings, in which:

FIG. 1 shows a single-sided buried-strap DRAM cell array with checkerboard geometry.

FIG. 2 shows a first test structure based on the invention.

FIG. 3 shows a second embodiment of a test structure based on the invention.

DETAILED DESCRIPTION OF THE INVENTION

Figure 1A:
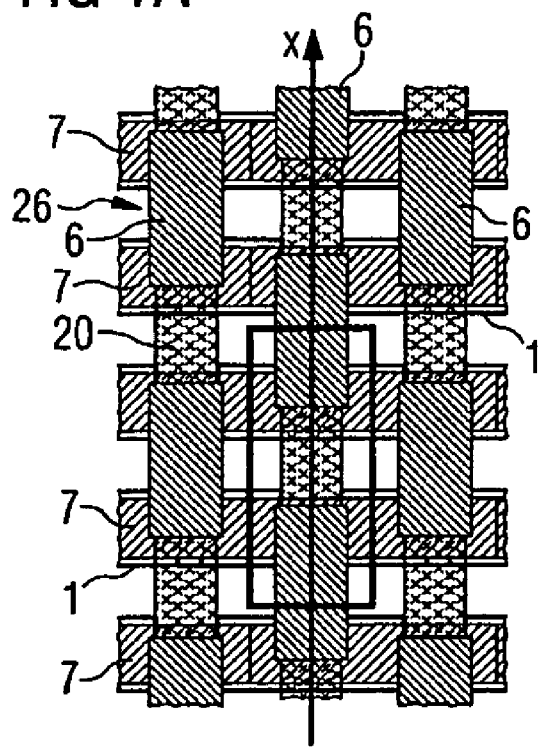
FIG. 1A shows the cell array in plan view.

The invention is explained for a single-sided buried-strap DRAM cell array concept using the example of a checkerboard geometry. The individual structures of the dynamic memory cell in the chip are preferably produced using silicon planar technology, which comprises a sequence of individual processes which respectively act over the whole surface of a silicon semiconductor wafer, with suitable masking steps being used directly to make a local change to the silicon substrate. In DRAM memory fabrication, a multiplicity of dynamic memory cells are produced simultaneously. The text below gives a brief description of the design of a single DRAM memory cell with reference to FIGS. 1C and D. DRAM memories predominantly use single-transistor cells whose circuit diagram is shown in FIG. 1C. These single-transistor cells comprise a storage capacitor 1 and a selection transistor 2. In this case, the selection transistor 2 is preferably in the form of a planar field effect transistor and has a source electrode 21, delivering current, and a drain electrode 23, receiving current, between which there is an active region 22 in which a current-conducting channel can form between the source electrode 21 and the drain electrode 23. Above the active region 22 there is an insulator layer 24 and a gate electrode 25 which act like a plate capacitor, which can be used to influence the charge density in the active region 22.

The drain electrode 23 of the field effect transistor 2 is connected to a first electrode 11 on the storage capacitor 1 by means of a connection on the buried strap 4. A second electrode 12 on the storage capacitor 1 is in turn connected to a capacitor plate 5 which is preferably common to the storage capacitors in the DRAM cell arrangement. The source electrode 21 of the field effect transistor 2 is connected to a bit line 6 in order to allow the information stored in the storage capacitor 1 in the form of charges to be read in and out. In this case, a read-in and read-out operation is controlled via a word line 7 which is connected to the gate electrode 25 of the field effect transistor 2 in order to produce a current-conducting channel in the active region 22 between the source electrode 21 and the drain electrode 23 through the application of a voltage.

The capacitors used in DRAMs in many cases are trench capacitors, in order to achieve a significant reduction in the memory cell area as a result of the three-dimensional structure. A section through a memory cell with a trench capacitor is shown in FIG. 1D. The trench capacitor 1 has a highly doped layer in a deep trench, said layer serving as an internal electrode 11. The external electrode 12 is produced by a highly doped region in the lower trench region around the internal electrode 11, the internal electrode 11 and the external electrode 12 being isolated by a dielectric layer 13. The selection transistor 2 is produced adjacent to the upper region of the trench capacitor 1 and has an active region 20 which comprises the source electrode 21 and the drain electrode 22 as highly doped diffusion regions, the region situated in-between forming the current-conducting channel region 23. Above the channel 23 there is the gate electrode 25, isolated by the insulator layer 24. In this arrangement, the gate electrode 25 is connected to the word line (not shown). The source electrode 21 is also connected to the bit line 6 via a bit line contact 26. In the upper trench region, the drain electrode 23 of the selection transistor 2 is connected to the internal electrode 11 in the trench capacitor via the buried strap connection 4. As an alternative to a trench capacitor 1, it is also possible to produce a three-dimensional storage capacitor with a stack capacitor, which is arranged above the selection transistor 2.

Figure 1B:
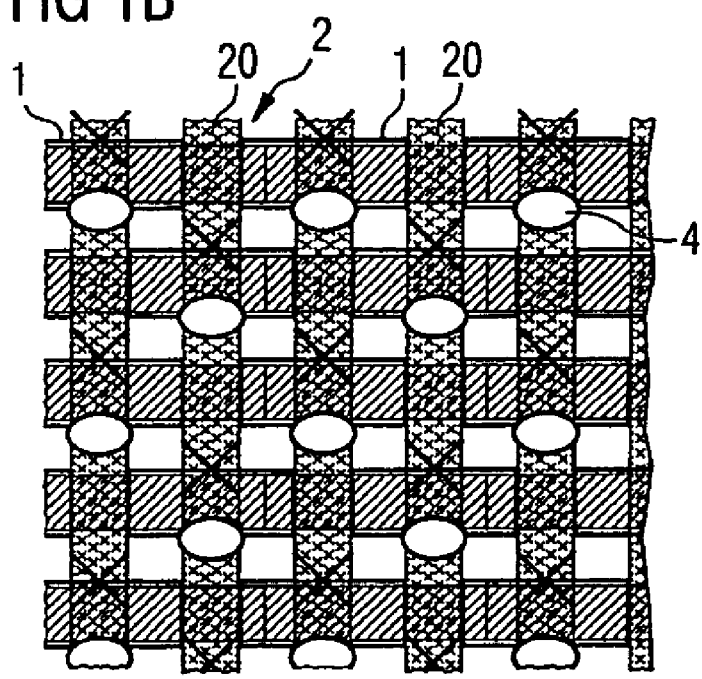
FIG. 1B shows the cell array with the level of the buried-strap junctions.
Figure 1C:
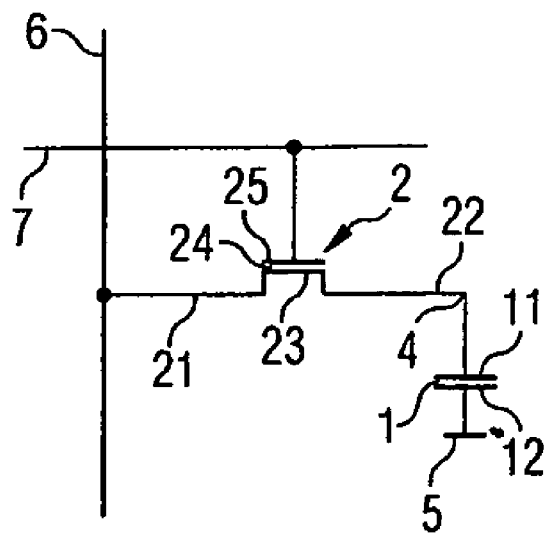
FIG. 1C shows the circuit diagram for a DRAM elementary cell.
Figure 1D:
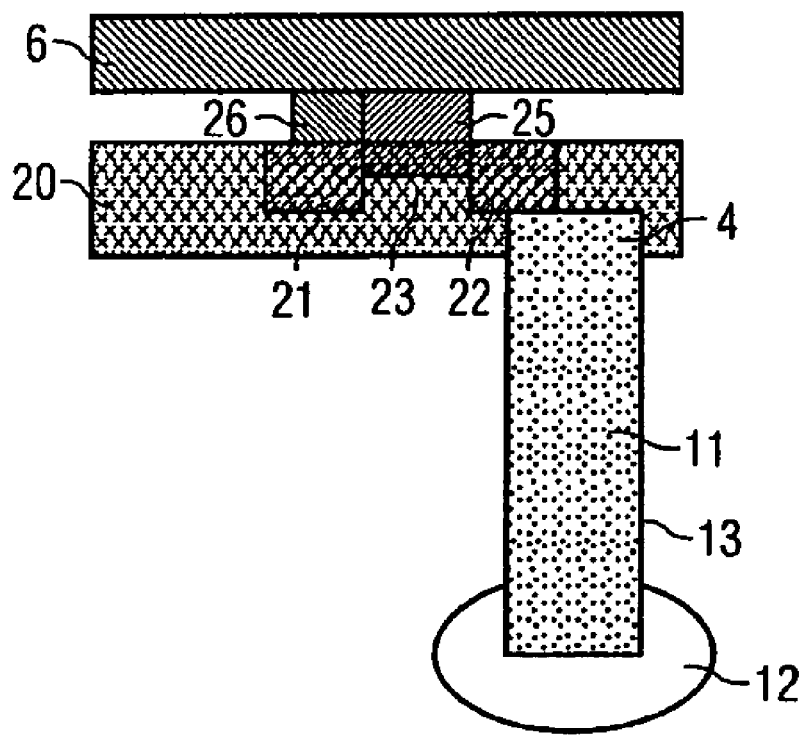
FIG. 1D shows a section along the X line in the region of the marked rectangle in FIG. 1A.

One advantageous DRAM memory concept is the single-sided buried-strap concept, which is shown in FIG. 1A schematically for a checkerboard geometry. In this case, the cell array is made up of bit lines 6 running in vertical rows and word lines 7 running in horizontal rows. Arranged below the vertically running rows of bit lines 6 are the active regions 20 of the connection transistors 2, which have contact made with them by the bit line contacts 26. The bit line contacts 26 in the individual rows are arranged offset from one another in this case, as shown by the plan view in FIG. 1A, in order to form a checkerboard geometry. The storage capacitors 1 are arranged along the word lines 7 and likewise produce a checkerboard geometry. In FIG. 1A, a DRAM memory cell is delimited as a rectangle in the plan view, and its sectional view along the X line is shown in FIG. 1D.

The connection 4 between the active regions 20 of the selection transistors 1 and the storage capacitors 2 is produced in the region of the overlapping areas, the single-sided buried-strap concept involving the selection transistors with the storage capacitors being respectively connected to one another in a single edge region of the overlapping area in the direction of the active region. The buried-strap junctions 4 between the selection transistors 2 and the storage capacitors 1 are marked with circles in the plan view in FIG. 1B, which shows the buried-strap level of the cell array. In the region of the buried straps, the electrical junction between the active region and the internal electrode in the storage capacitor has a finite resistance of approximately 15 kohm. In the region of the crosses, however, the active regions 20 of the selection transistors and the internal electrodes in the storage capacitors 1 are electrically isolated from one another, i.e. there is no electrical connection.

FIG. 2 shows a first test structure based on the invention for determining the electrical properties of the memory cells in the single-sided buried-strap DRAM cell concept. The test structure is preferably produced in the kerf region, i.e. in the region on a wafer between two DRAM memory chips. In this case, the aim is a test design which is as simple as possible and which, in comparison with the conventional memory cell design, essentially requires no additional process steps. At the same time, the test structure needs to be as close as possible to the checkerboard geometry, in order to simulate the electrical parameters of the DRAM memory cell as accurately as possible The invention achieves this by virtue of the internal electrodes in the storage capacitors in two adjacent memory cells being connected to one another in the direction of the bit lines, i.e. the active regions, in order to produce a series circuit for the two adjacent memory cells comprising the first selection transistor, the first storage capacitor, the second selection transistor and the second storage capacitor. At the same time, the bit line is interrupted between the first and the second selection transistors.

Figure 2A:
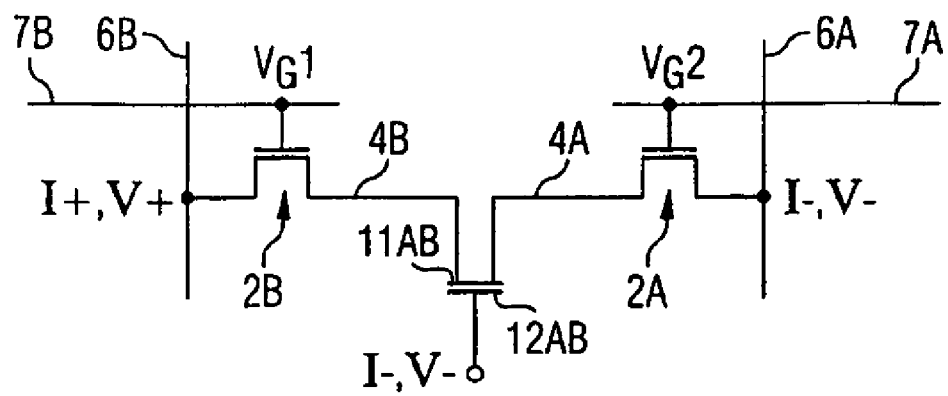
FIG. 2A shows a circuit diagram.
Figure 2B:
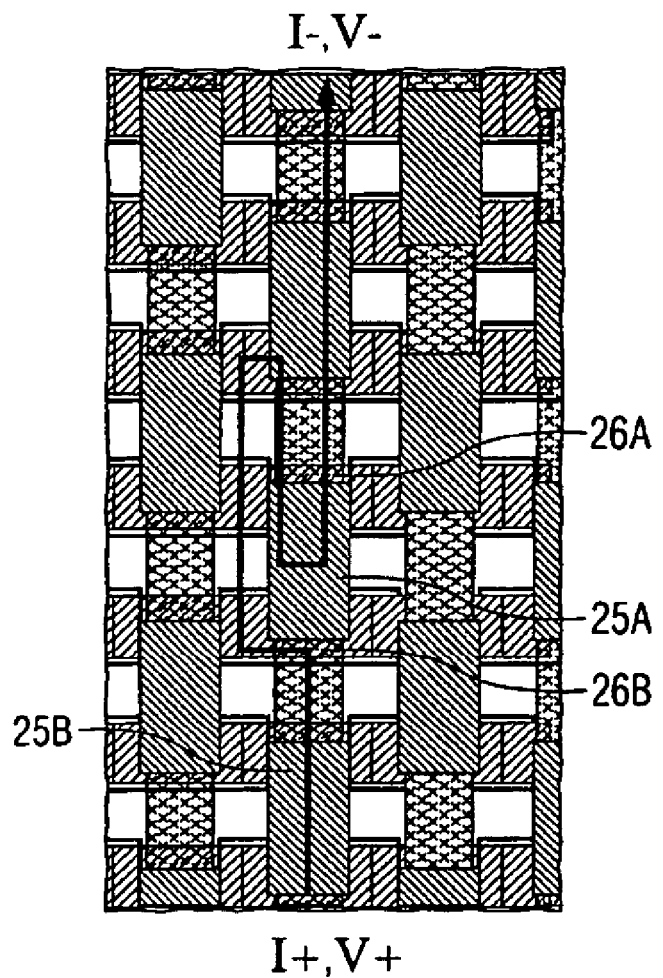
FIG. 2B shows a plan view of the invention.

FIG. 2A shows the inventive back-to-back connection of the two memory cells as a circuit diagram. A memory cell A and a memory cell B each have a selection transistor 2A, 2B, which is of similar design to the selection transistor shown in FIG. 1C. However, the two selection transistors 2A, 2B are connected via a common storage capacitor 1AB which has a single internal electrode 11AB. The external electrode 12AB is also of integral design, as shown in FIG. 2A. Alternatively, however, separate external electrodes may also be used.

Figure 2C:
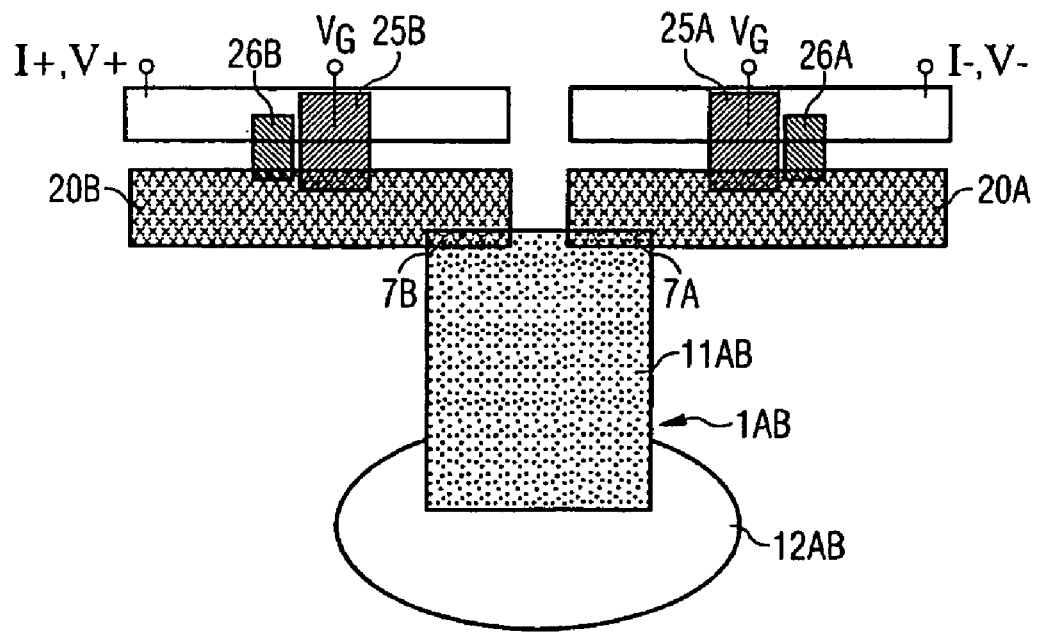
FIG. 2C shows a sectional view along the arrow in FIG. 2B.
Figure 2D:
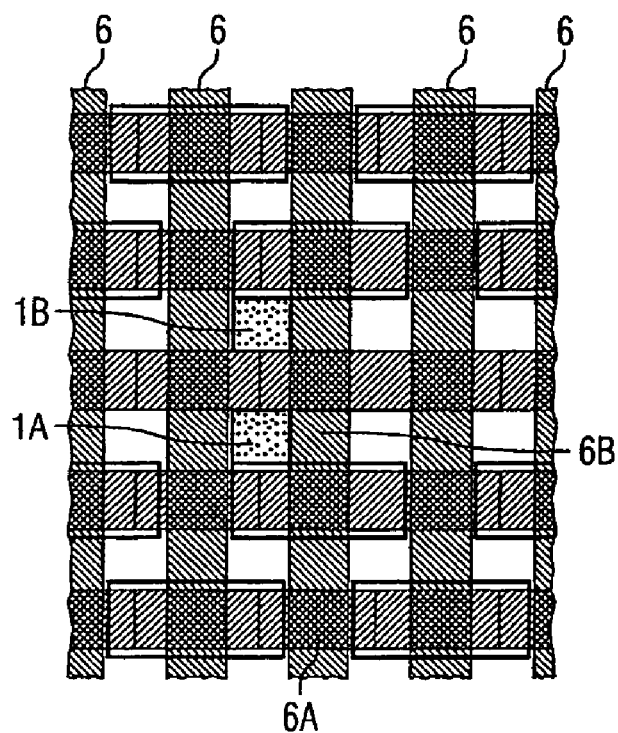
FIG. 2D shows a plan view with a trench capacitor and the first metallization plane.

The common internal electrode 11AB is connected to the associated selection transistor 2A, 2B by means of a respective single-sided buried-strap contact 4A, 4B. The two selection transistors 2A, 2B are in turn connected to respective word lines 7A, 7B and bit lines 6A, 6B. FIG. 1B shows a plan view of the inventive test structure with a checkerboard pattern for the test DRAM memory cells which is essentially identical to the regular single-sided buried-strap memory cell concept in checkerboard geometry, as shown in FIG. 1A. In the region of the test structure, however, as can clearly be seen in FIG. 2D, which shows the levels of the storage capacitors and the bit lines in the test structure, two adjacent storage capacitors 1A, 1B are connected to one another via their internal electrodes. In addition, the bit line 6 is interrupted between the two associated selection transistors, so that the two selection transistors 2A, 2B have contact made with them via separate bit lines 6A, 6B. For clarification purposes, FIG. 2C shows the inventive test structure in a sectional illustration along the arrow line in FIG. 2B.

The inventive test structure can be used to measure a current-voltage characteristic via the path comprising bit line section 6A, bit line contact 26A, active region 20A of the selection transistor 2A, buried strap 7A, bridged internal electrode 11AB in the two adjacent storage capacitors 1A, 1B, buried strap contact 7B, active region 20B of the selection transistor 2B, bit line contact 26B and bit line section 6B. In addition, the electrical potentials VG1, VG2 on the gate electrodes of the two selection transistors 2A, 2B can be varied for this measurement. It is additionally possible to modify the electrical potentials of the adjacent word lines and storage capacitors. The inventive test structure, in which the internal electrodes in two adjacent storage capacitors are produced together or are conductively connected to one another by means of a bridge and the bit line is interrupted between the two associated selection transistors, alters the regular DRAM cell array geometry based on the single-sided buried-strap concept only to a minimal extent, which means that a current-voltage characteristic for the two back-to-back-coupled elementary cells permits accurate statements about the electrical properties of the DRAM elementary cells including the supply line resistances and the influence of switching adjacent word lines.

Figure 3A:
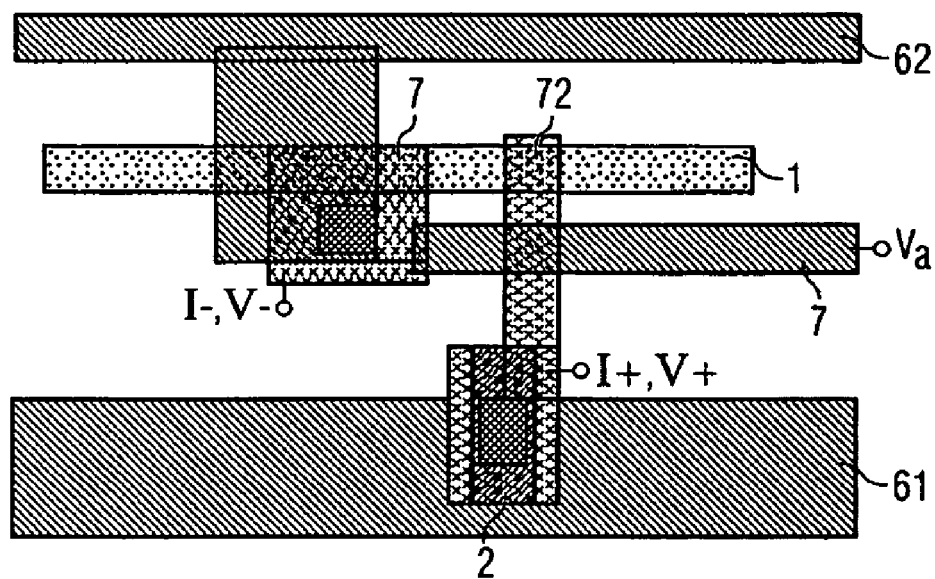
FIG. 3A shows a plan view of the invention.
Figure 3B:
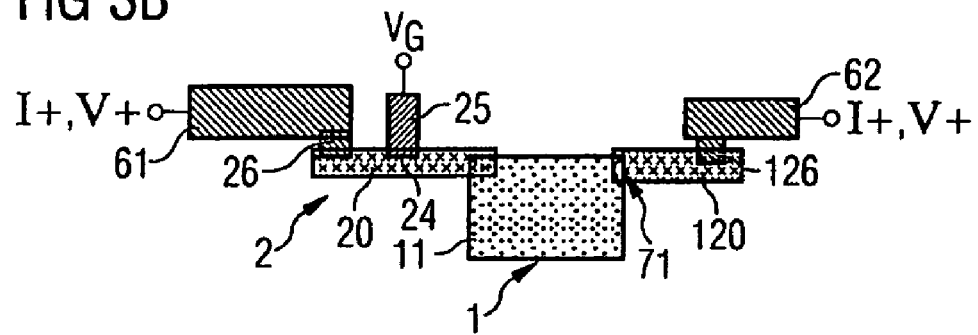
FIG. 3B shows a sectional illustration.

A second inventive embodiment of a test structure for determining the electrical properties of a memory cell in the single-sided buried-strap DRAM memory cell concept is shown in FIG. 3B. The aim of this test structure is to be able to determine, in particular, the properties of a single DRAM memory cell with a selection transistor with an associated storage capacitor and, at the same time, to provide the option of varying the channel length in the active region of the selection transistors and of minimizing the supply line effects. This is achieved in that the internal electrode in a storage capacitor in a test DRAM memory cell next to the buried-strap contact for the selection transistor has a further conductive connection at the same edge region, at which the buried-strap contact is produced between the selection transistor and the internal electrode in the storage capacitor, to a bit line which is adjacent to the bit line which makes contact with the active region of the selection transistor.

FIG. 3A shows a plan view of the inventive test structure and FIG. 3B shows a schematic sectional illustration. The active region 20 of the selection transistor 2 is connected via the associated bit line 61 and the bit line contact 26, the active region 20 being connected to the internal electrode 11 in the storage capacitor 1 via the buried-strap contact 7. The storage capacitor 1 is connected to an adjacent bit line 62 via an additional conductive connection 71, which is electrically insulated from the buried-strap contact 7, which produces the connection from the active region 20 of the selection transistor 2 to the internal electrode 11 in the storage capacitor 1, via a further active region 120 and a further bit line contact 126. This design makes it possible to measure a current-voltage characteristic via the path comprising bit line 61, bit line contact 26 of the selection transistor 2, buried strap 7, internal electrode 11 in the storage capacitor 1, electrical connection 71, active region 120, bit line contact 126 and bit line 62. The current-voltage characteristic can then be used to infer the electrical properties of the selection transistor.

It is also possible to produce, in a kerf region in checkerboard geometry, a multiplicity of test structures having an additional conductive connection at the edge region of the overlapping area, at which edge region the buried strap contact is produced between the active region of the selection transistor and the internal electrode in the storage capacitor, to a bit line which is adjacent to the bit line which makes contact with the active region of the selection transistor, the length of the associated active regions of the individual selection transistors and/or the width of the associated gate electrode with the word line being able to be varied.

The inventive test structure thus makes it possible for the geometry of the test structure essentially to simulate the corresponding single-sided buried-strap memory cell array concept and at the same time to keep the supply lines to the test structure at as low a resistance as possible, so that the test result for determining the electrical properties of the elementary cell is hardly impaired. At the same time, by varying the length of the active regions and hence of the current-conducting channel in the selection transistors it is possible to test tolerances for the selection transistors which arise when producing the memory cell array.

What is claimed is:

1. A test structure for determining the electrical properties of memory cells, comprising:

a selection transistor and a storage capacitor, in a matrix-like cell array, where the selection transistors have an active region with a gate electrode, where the active region is conductively connected to a bit line and an internal electrode in the storage capacitor, and the gate electrode is conductively connected to a word line, where the active regions of the selection transistors are arranged in rows in a first direction, and the storage capacitors are arranged in rows in a second direction, which runs transversely with respect to the first direction, where the conductive connection between the active region of the selection transistor and the internal electrode in the storage capacitor in the memory cells on overlapping areas of the crossing rows of active regions and storage capacitors is respectively produced in a single edge region of the overlapping area, where the bit lines run in the first direction, making contact with the active regions of the selection transistors in the first direction, and the word lines run in the second direction, making contact with the gate electrodes of the selection transistors in the second direction, wherein the internal electrodes in the storage capacitors in two adjacent memory cells are connected to one another to produce a series circuit comprising the first selection transistor, the first storage capacitor, the second storage capacitor and the second selection transistor in the two adjacent memory cells, the active regions of the first and second selection transistors not being connected by means of the bit line which makes contact with the first and second selection transistors.

2. The test structure as claimed in claim 1, wherein the storage capacitors are trench capacitors and the internal electrodes in the trench capacitors in two adjacent memory cells in the first direction are connected to one another via a tunnel structure.

3. A test structure for determining the electrical properties of memory cells, comprising:

a selection transistor and a storage capacitor, in a matrix-like cell array, where the selection transistors have an active region with a gate electrode, where the active region is conductively connected to a bit line and an internal electrode in the storage capacitor, and the gate electrode is conductively connected to a word line, where the active regions of the selection transistors are arranged in rows in a first direction, and the storage capacitors are arranged in rows in a second direction, which runs transversely with respect to the first direction, where the conductive connection between the active region of the selection transistor and the internal electrode in the storage capacitor in the memory cells on overlapping areas of the crossing rows of active regions and storage capacitors is respectively produced in a single edge region of the overlapping area, where the bit lines run in the first direction, making contact with the active regions of the selection transistors in the first direction, and the word lines run in the second direction, making contact with the gate electrodes of the selection transistors in the second direction, wherein the internal electrode in a storage capacitor in a memory cell has a further conductive connection at the edge region of the overlapping area in the first direction, at which edge region the conductive connection is produced between the active region of the selection transistor and the internal electrode in the storage capacitor, to a bit line which is adjacent to the bit line which makes contact with the active region of the selection transistor.

4. The test structure as claimed in claim 3, wherein the internal electrodes in the storage capacitors in a multiplicity of memory cells have a further conductive connection at the edge region of the overlapping area in the first direction, at which edge region the conductive connection is produced between the active region of the selection transistor and the internal electrode in the storage capacitor, to a bit line which is adjacent to the bit line which makes contact with the active region of the selection transistor, the length of the associated active regions of the selection transistors and/or the width of the associated gate electrode with the word line varying.

5. The test structure as claimed in claim 3, wherein the storage capacitors are trench capacitors which have a substantially rectangular cross section in plan view, the conductive connection between the active region of the selection transistor and the internal electrode in the trench capacitor and the conductive connection between the internal electrode in the trench capacitor and the bit line which is adjacent to the bit line which makes contact with the active region of the selection transistor being produced on one longitudinal side of the rectangular cross section of the trench capacitor.

* * * * *